United States Patent [19]

Rieger

[11] 3,805,123

[45] Apr. 16, 1974

[54] ARRANGEMENT FOR ADHESIVELY JOINING HEAT-DISSIPATING CIRCUIT COMPONENTS TO HEAT SINKS AND METHOD OF MAKING THEM

[75] Inventor: Peter Rieger, Vienna, Austria

[73] Assignee: ITT Industries, Inc., New York, N.Y.

[22] Filed: Dec. 12, 1972

[21] Appl. No.: 314,479

[52] U.S. Cl. ..... 317/234 R, 317/234 A, 317/234 E, 317/234 G, 174/52 S, 29/589

[51] Int. Cl. .......... H01l 3/00, H01l 5/00

[58] Field of Search .......... 317/234, 1, 3, 4, 29; 174/52 S; 29/589

[56] References Cited

UNITED STATES PATENTS

| | | | |
|---|---|---|---|
| 3,058,041 | 10/1962 | Happ | 317/234 A |
| 3,299,331 | 1/1967 | Lacy | 317/234 A |
| 3,377,524 | 4/1968 | Bock et al. | 317/234 A |
| 3,444,399 | 5/1969 | Jones | 317/234 A |
| 3,391,242 | 7/1968 | Sudges | 317/234 A |
| 3,492,586 | 1/1970 | Leffmann | 317/234 A |

*Primary Examiner*—Andrew J. James
*Attorney, Agent, or Firm*—John T. O'Halloran; Menotti J. Lombardi, Jr.; Vincent Ingrassia

[57] ABSTRACT

This invention relates to a method and an arrangement of mounting semiconductor elements on heat sinks. The switching element is glued inseparably to an intermediate layer consisting of cleavable material. One side of the intermediate layer is glued inseparably to the heat sink. If a defective switching element has to be replaced, a moderate impact on the mounting plate of the element in parallel to the surface of the heat sink is sufficient to cause an exact cleavage.

3 Claims, 3 Drawing Figures

ARRANGEMENT FOR ADHESIVELY JOINING HEAT-DISSIPATING CIRCUIT COMPONENTS TO HEAT SINKS AND METHOD OF MAKING THEM

BACKGROUND OF THE INVENTION

This invention relates to an arrangement for adhesively joining heat-dissipating circuit components, particularly power semiconductor circuit components, to heat sinks and a method of making them.

It is known to make adhesive joints between heat-dissipating circuit components, such as power semiconductor circuit components (power transistors, thyristors, power diodes etc.) and heat sinks. To ensure a good cooling effect, the resistance to the transmission of heat between the circuit component and the heat sink should be minimized. For this reason the circuit component is inseparably adhered to the heat sink by means of a curable plastics material adhesive. This ensures a good transmission of heat from the circuit component to the heat sink but involves the disadvantage that the circuit component when damaged cannot be separated from the heat sink. If several circuit components are mounted on a common heat sink, the need for a replacement of even a single defective circuit component necessitates the replacement of a considerable number of circuit components although they are still usable.

In telecommunication exchange installations it is essential to use open contacts as well as semiconductor circuit components, which are often secured to a heat sink which is common to several or even many circuit components. In such arrangements it is often necessary to replace a single semiconductor circuit component because it has become defective whereas it is not desired to discard a plurality of still usable circuit components only because they are inseparably mounted on the heat sink concerned.

For this reason it has been attempted to join each of a plurality of circuit components to a common heat sink in such a manner that each circuit component can be separated from the heat sink. When circuit components are joined in this manner to cooling elements, the non-planarity of surface in contact with each other inevitably results in a high resistance to the transmission of heat and high rises of the temperature of the circuit component concerned. It has been attempted to avoid this disadvantage in that materials having a high thermal conductivity are provided between the component and the heat sink so that these materials completely fill any clearances between the superimposed surfaces of the circuit component and the heat sink. Polysiloxanes are known which have a high thermal conductivity and may be used as such materials in the form of silicon oils, silicon greases and silicone resins. A layer of silicone oil or silicone grease with optional admixtures of high thermal conductivity may be placed between the superimposed surfaces of the circuit component and heat sink and may enable a sufficient dissipation of heat to the heat sink. Besides, each of a plurality of circuit components which are mounted on a common heat sink may be separated from the latter. In installations in which such arrangements are used and which comprise also circuit components having open contacts, such as relays or the like, the use of silicone oils or silicone greases has often resulted in difficulties in the closing of these open contacts.

SUMMARY OF THE INVENTION

It is an object of the invention to provide an arrangement for adhesively joining heat-dissipating circuit components to heat sinks, in which a good heat transfer from the circuit component to the heat sink is ensured.

It is a further object of the invention that the use of silicone oils is avoided and each circuit component can easily and simply be separated from a heat sink which is common to a plurality of circuit components.

According to a broad aspect of the invention, there is provided a heat-dissipating semiconductor device comprising a semiconductor circuit component, a first layer of curable adheisve inseparably adhering to a surface of said component, a heat sink, a second layer of curable adhesive inseparably adhering to the surface of said heat sink and an intermediate layer of material which can be split into sheets inseparably adhering to said first and second layers securing said component to said heat sink.

It is a feature of the invention that the heat sink be provided with a bore, which extends through the heat sink and is in register with the circuit component adhered to the heat sink.

This arrangement facilitates the separation of a defective circuit component from the associated heat sink because a pin-shaped tool can be inserted into the bore and used to force the circuit component to be separated away from the heat sink.

According to a further feature of the invention, the bore which extends through the heat sink serves to accommodate a temperature sensor of known type so that the temperature occurring at the circuit component can be monitored in a simple manner.

According to a further object of the invention there is provided a method of making a separable adhesive joint between a heat-dissipating circuit component and a heat sink comprising covering both surfaces of a sheetlike intermediate layer of material, which splits into sheets when subjected to forces parallel to the surface of said intermediate layer, with a curable plastic material adhesive, applying said component to one surface of said intermediate layer, applying said heat sink to a second surface of said intermediate layer and applying a pressure to said heat sink and said component in a direction perpendicular to the surface of said intermediate layer whereby said heat sink and said component are secured to said intermediate layer.

When a circuit component which has been adhered to a heat sink by the method according to the invention must be replaced by another circuit component, the circuit component to be removed can easily be separated when the electrode terminals and fixing screws have been disconnected because a slight impact applied to the baseplate of the component to be separated, which impact is applied in a direction that is parallel to the surface of the heat sink, will split the intermediate layer so that the circuit component can be separated from the heat sink. If that portion of the intermediate layer which adheres to the heat sink can be split several times, a different circuit component may be directly adhered to this part of the intermediate layer instead of the circuit component which has been removed. Otherwise, a new intermediate element must be provided, which is covered on both sides with a curable plastics material adhesive, and must be applied to the heat sink, whereafter the new circuit component is applied to said intermediate element and is inseparably connected thereto by means of pressure applied by the fixing screws.

The above and other objects of the present invention will be better understood from the following detailed description taken in conjunction with the accompanying drawings in which:

DESCRIPTION OF THE PREFERRED EMBODIMENT

Figure 1:
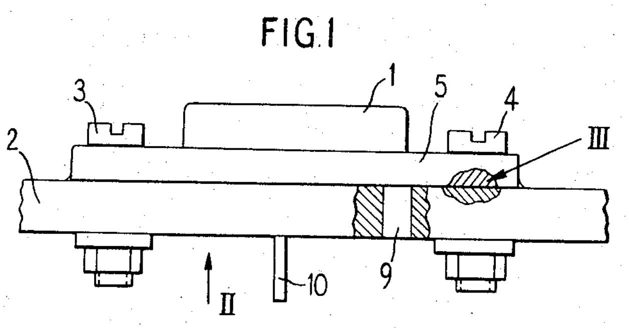
FIg. 1 shows an arrangement of a circuit component on a heat sink which may be used for a plurality of circuit components, if desired.

It is apparent from FIG. 1 how a heat-dissipating semiconductor circuit component 1 is held in the arrangement according to the invention on a heat sink 2 by two fixing screws 3 and 4. This is also apparent from the bottom plan view of FIG. 2.

In the embodiment shown by way of example, the baseplate 5 of the semiconductor circuit component 1 serves as a collector electrode, which is in good thermally conducting contact with the heat sink 2. The heat sink 2 may be common to a plurality of circuit components.

Figure 3:
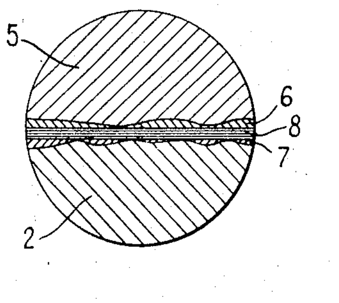
FIG. 3 is an enlarged fragmentary view showing a portion of the joint between the circuit component and heat sink.

The joint between the baseplate 5 of the circuit component 1 and the surface of the heat sink 2 is shown on an enlarged scale in FIG. 3. The baseplate 5 is inseparably joined by a curable adhesively layer 6, which has a high thermal conductivity, to an intermediate layer 8, which consists of a material which can be split well. The underside of the intermediate layer 8 is also inseparably joined to the surface of the heat sink 2 by an adhesive layer 7. As a result, the semiconductor circuit component 1 is connected to the heat sink 2 by an intimate joint, which has a high thermal conductivity so that good heat-conducting properties are ensured.

When it is necessary to separate a circuit component, e.g., one which has become defective, from the heat sink, and the electrode terminals have been disconnected and the fixing screws have been removed, a slight impact on the baseplate of the component to be separated, which impact is directed parallel to the surface of the heat sink, will be sufficient to ensure a splitting of the interlayer so that the circuit component can be separated from the heat sink.

If that portion of the intermediate layer which adheres to the heat sink can be split several times, a different circuit component may be directly adhered to this part of the intermediate layer instead of the circuit component which has been removed. Otherwise, a new intermediate element must be provided, which is covered on both sides with a curable plastics material adhesive, and must be applied to the heat sink, whereafter the new circuit component is applied to said intermediate element and is inseparably connected thereto by means of pressure applied by the fixing screws.

The intermediate layer 8 which can be split serves to facilitate the separation of the semiconductor circuit component from the heat sink when this is desired. This is enabled because the intermediate layer 8 can be well and easily split in one or more planes parallel to its surface. In the embodiment shown by way of example, the heat sink consists of a heat sink plate 2.

Such properties are exhibited, e.g., by small mica plates, which have a pronounced ability to be split parallel to the crystal planes.

Other splittable materials may be used for this purpose, provided that they can be split parallel to their plane which faces the heat sink, e.g., two or more thin layers of metal or varnish or plastics material, which adhere to each other, e.g., in the manner in which electroplated metal coatings adhere to the base metal, but which can easily be separated from each other without substantial effort or with the aid of solvents or softening agents where layers of varnish or plastics material are concerned. The separation of the semiconductor circuit components from the heat sink to which they are secured may be facilitated by a simple pin-shaped too, which can be inserted through the bore 9 and forced against the baseplate 5 of the circuit component 1. This bore 9 may be advantageously used also for a measurement of temperature if a temperature sensor is inserted into the bore.

Figure 2:
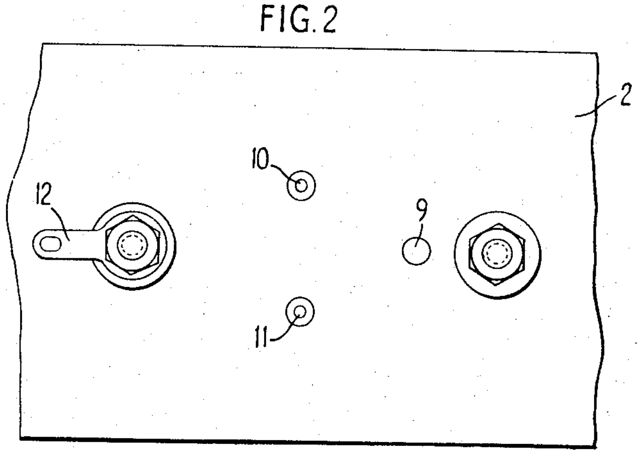
FIG. 2 is a bottom plan view showing the arrangement of FIG. 1 viewed in the direction of the arrow.

FIG. 2 indicates the lead-ins 10, 11 for the connections to the base and emitter electrodes and the terminal lug 12 for the collector electrode of the semiconductor circuit component 1 shown in FIG. 1.

It is to be understood that the foregoing description of specific examples of this invention is made by way of example only and is not to be considered as a limitation on its scope.

I claim:

1. A heat-dissipating semiconductor device comprising:

- a semiconductor circuit component;
- a first layer of curable adhesive inseparably adhering to a surface of said component;
- a heat sink;
- a second layer of curable adhesive inseparably adhering to a surface of said heat sink; and
- an intermediate layer of material which can be split into sheets inseparably adhering to said first and second layers securing said component to said heat sink.

2. A heat-dissipating semiconductor device according to claim 1 wherein the heat sink is provided with a bore which extends through the heat sink and is in register with the circuit component adhering to the heat sink.

3. A method of making a separable adhesive joint between a heat-dissipating circuit component and a heat sink comprising:

- covering both surfaces of a sheetlike intermediate layer of material, which splits into sheets when subjected to forces parallel to the surface of said intermediate layer, with a curable plastic material adhesive;
- applying said component to one surface of said intermediate layer;
- applying said heat sink to a second surface of said intermediate layer; and
- applying a pressure to said heat sink and said component in a dirction perpendicular to the surface of said intermediate layer whereby said heat sink and said component are secured to said intermediate layer.

* * * * *